United States Patent
Payakapan et al.

(12)

(10) Patent No.: US 7,302,625 B1
(45) Date of Patent: Nov. 27, 2007

(54) BUILT-IN SELF TEST (BIST) TECHNOLOGY FOR TESTING FIELD PROGRAMMABLE GATE ARRAYS (FPGAS) USING PARTIAL RECONFIGURATION

(75) Inventors: Tassanee Payakapan, San Jose, CA (US); Lee Ni Chung, San Jose, CA (US); Shahin Toutounchi, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 52 days.

(21) Appl. No.: 11/284,455

(22) Filed: Nov. 21, 2005

(51) Int. Cl.
*G01R 31/28* (2006.01)
(52) U.S. Cl. .................. 714/733; 714/725; 714/734
(58) Field of Classification Search ............... None
See application file for complete search history.

(56) References Cited

U.S. PATENT DOCUMENTS 7,124,338 B1 * 10/2006 Mark et al. ............. 714/725
7,188,283 B1 * 3/2007 Shafer et al. ............ 714/725

* cited by examiner

*Primary Examiner*—Cynthia Britt
*Assistant Examiner*—John J. Tabone, Jr.
(74) *Attorney, Agent, or Firm*—Thomas A. Ward; Kevin T. Cuenot

(57) ABSTRACT

A Built-in Self Test (BIST) system is provided in a Field Programmable Gate Array (FPGA) that can adjust test signal patterns provided for testing after partial reconfiguration of the FPGA. The BIST system includes a decoder that monitors I/O signals and provides an output indicating when I/O signals change indicating partial reconfiguration has occurred. The decoder output is provided to a BIST test signal generator providing signals to an IP core of the FPGA as well as a BIST comparator for monitoring test results to change test signals depending on the partial configuration mode.

12 Claims, 2 Drawing Sheets

BUILT-IN SELF TEST (BIST) TECHNOLOGY FOR TESTING FIELD PROGRAMMABLE GATE ARRAYS (FPGAS) USING PARTIAL RECONFIGURATION

BACKGROUND

1. Technical Field

The present invention relates to a Built-in Self Test (BIST) system used in a Field Programmable Gate Array (FPGA). More particularly, the present invention relates to providing a BIST in an FPGA that provides for partial reconfiguration.

2. Related Art

As integrated circuit (IC) devices continue to increase in complexity, it is increasingly difficult to test the devices. In particular, in order to test an IC, a large number of test patterns and configurations may be required. The response to the test patterns is then monitored to determine if defects are present. This testing is time-consuming and may use all of the input/output pins of the integrated circuit. Accordingly, it is known to provide one or more circuits in the IC itself to provide a Built-In Self Test (BIST) system.

One type of IC that is becoming increasingly more complex, and thus typically includes a BIST system is a FPGA. FPGAs are programmable or customizable versions of Application Specific Integrated Circuits (ASICs). As opposed to ASICs, programmability enables FPGAs to be purchased by customers and configured to provide a desired circuit.

A large portion of test time for an FPGA is spent configuring or programming the part. Some FPGAs provide for partial reconfiguration to provide for more rapid reprogramming after startup. With partial reconfiguration, portions of the FPGA are reprogrammed, while the remaining portions remain configured without reprogramming. In some cases, partial reconfiguration allows the FPGA to continue operation during the partial reprogramming since certain modules within the FPGA that are not reprogrammed can continue functioning.

A block diagram of components of a conventional FPGA is shown in FIG. 1. The FPGA includes input/output (I/O) blocks 2 (each labeled IO) located around the perimeter of the FPGA, multi-gigabit transceivers (MGT) 4 interspersed with the I/O blocks 2, configurable logic blocks 6 (each labeled CLB) arranged in an array, block random access memory 8 (each labeled BRAM) interspersed with the CLBs, configuration logic 12, configuration interface 14, on-chip processor 16 and an internal configuration access port (ICAP) 20. The FPGA also includes other elements, such as a programmable interconnect structure and a configuration memory array, which are not illustrated in FIG. 1. Although FIG. 1 shows a relatively small number of I/O blocks 2, CLBs 6 and block RAMs 8 for illustration purposes, it is understood that an FPGA typically includes many more of these elements.

In general, the FPGA of FIG. 1 is configured in response to a set of configuration data values that are loaded into a configuration memory array of the FPGA from an external store via configuration interface 14 and configuration logic 12. Configuration interface 14 can be, for example, a parallel select map interface, a JTAG interface, or a master-serial interface. The configuration memory array can be visualized as a rectangular array of bits. The bits are grouped into frames that are one-bit wide words that extend in columns from the top of the array to the bottom. The configuration data values are typically loaded into the configuration memory array one frame at a time from the external store via the configuration interface 14.

The FPGA can be reconfigured by rewriting data in the configuration memory array. In one reconfiguration method, the ICAP 20 is used to rewrite data in the configuration memory array in order to generate or instantiate the FPGA's internal logic (e.g., CLB's 6 and BRAMs 8). In other words, one part of the configured FPGA can reconfigure another part of the FPGA. Without using the ICAP, reconfiguration can also be performed by loading reconfiguration frames through the configuration interface 14 using external customized logic components to over-write frame data in the configuration memory array.

More efficient reconfiguration of an FPGA is performed by only rewriting a portion of the frames or columns in the configuration memory array using partial reconfiguration. One way to enable an FPGA to take advantage of partial reconfiguration is to have the FPGA partitioned into physically separate modules. Each module provides circuit resources for implementing a task, i.e. an algorithm. More complex modules are sometimes termed as Intellectual Property (IP) cores. As the processing requirements change, one or more of the modules are updated only to a degree necessary to perform a new algorithm. Similarly, smaller manipulations of a module can be made such as a change in inputs and outputs. Because modifications to the algorithms performed by a module typically require modification of only a portion of the frames in the configuration memory, efficient operation can result using partial reconfiguration.

In order to provide for efficient partial reconfiguration, a circuit arrangement shown in FIG. 2 is provided. To control reading and writing of data into the configuration memory array 30 of an FPGA, a controller 32 is used. The controller 32 can be included with the ICAP 20 internal to the FPGA. For externally controlled reconfiguration, the controller 32 can also be provided outside the FPGA. To mirror data in the configuration memory array 30, configuration store 34 is used, enabling faster data reading and writing. The configuration store 34 speeds read and write operations because a bottleneck is otherwise created through the configuration interface 14 to the configuration memory array 30. With the configuration store 34 used, data is first modified in the configuration store 34 and later loaded into the configuration memory array 30 through the configuration interface 14 in a frame-by-frame manner.

In a further embodiment for partial reconfiguration, the modification store 36 is added. The modification store 36 includes information identifying physical resources to be modified and the state to which they will be modified. As opposed to the configuration store 34, the controller 32 can read and modify portions of frames in the configuration store 34 using the modification store 36 as a reference, rather than being required to modify entire frames significantly reducing modification time.

With FPGAs providing partial reconfiguration, it is desirable to have a BIST system that can adapt to the partial changes to continue to provide for self testing of all possible signal patterns provided within the FPGA after components have been partially reconfigured.

It is further desirable to have a BIST system that can take advantage of partial reconfiguration of a system to reduce overall test time, as compared to full reconfiguration that would otherwise consume substantial test time while reconfiguring.

SUMMARY

In accordance with embodiments of the present invention, a BIST system of an FPGA is provided that adapts to a partial reconfiguration of the FPGA to continue to provide for self testing of the reconfigured components.

The BIST system further allows for overall test time to be reduced to a fraction of previous test times that full reconfiguration required. With partial reconfiguration, only a fraction of the total configuration bits will be loaded between test patterns, substantially reducing overall test time.

To handle different configurations, the BIST system includes a decoder programmed into components, such as CLBs of the FPGA, with inputs of the decoder receiving I/O signals provided to the FPGA. The decoder detects I/O signals to determine the state of the signals to indicate if partial reconfiguration has occurred. The BIST system provides a signal indicating if partial reconfiguration has occurred to components of the BIST controlling self-testing.

The BIST system provides the signal from the decoder circuit to indicate the partial reconfiguration mode to a test signal generator circuit as well as to comparison logic that receives and monitors test results. The test signal generator is configured into CLBs and other components of the FPGA and provides test signals to an IP core. Outputs of the IP core are then provided to the comparator circuit that compares the IP core output signals with expected test results, depending on the partial reconfiguration mode.

BRIEF DESCRIPTION OF THE DRAWINGS

Further details of the present invention are explained with the help of the attached drawings in which.

DETAILED DESCRIPTION

Figure 1:
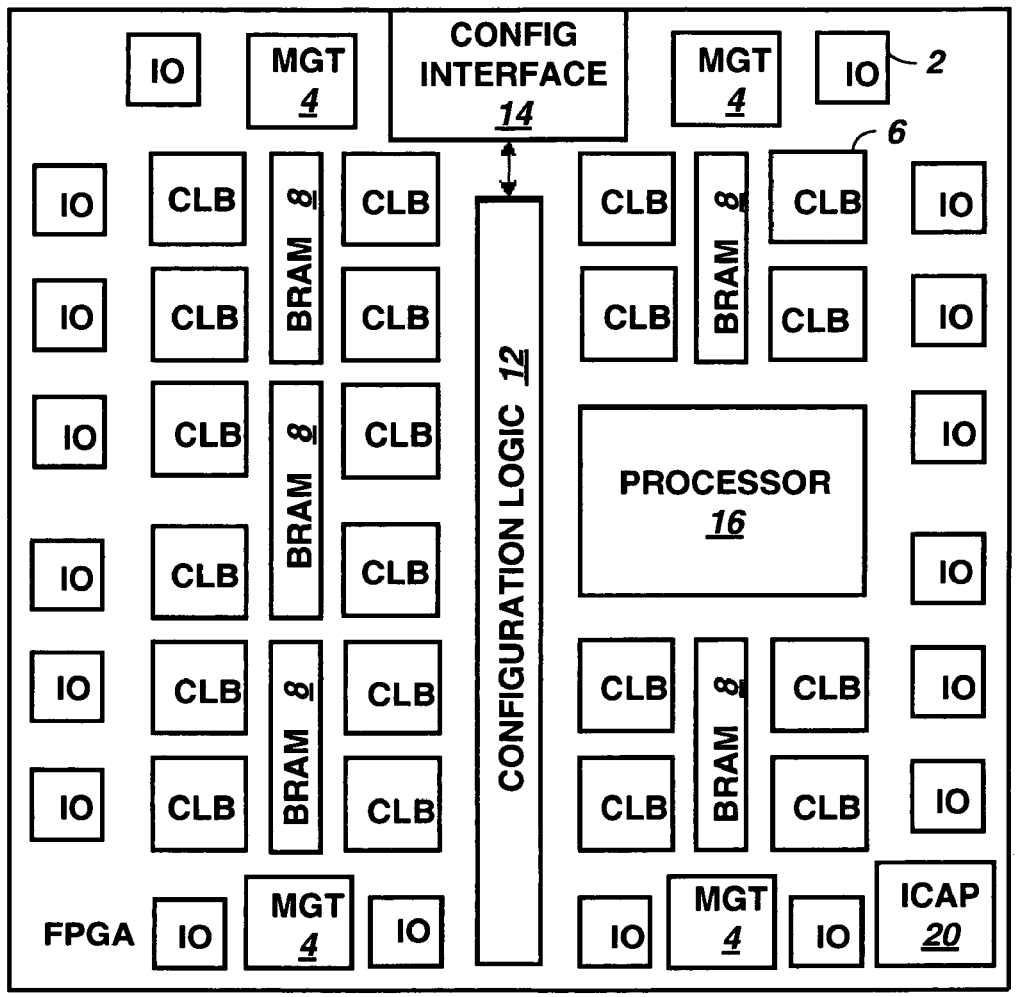
FIG. 1 shows a block diagram of typical components of an FPGA.
Figure 2:
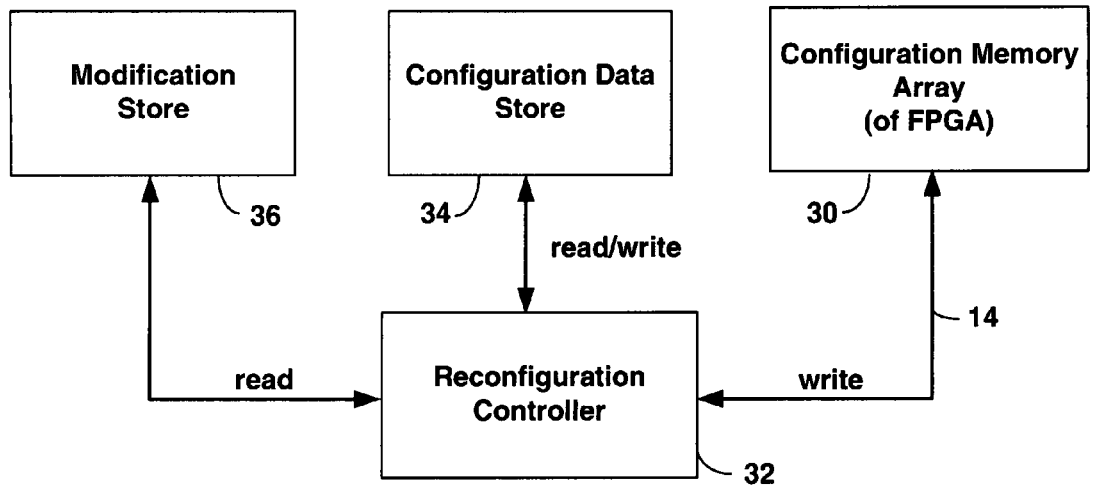
FIG. 2 shows a block diagram of components used for partial reconfiguration of an FPGA.
Figure 3:
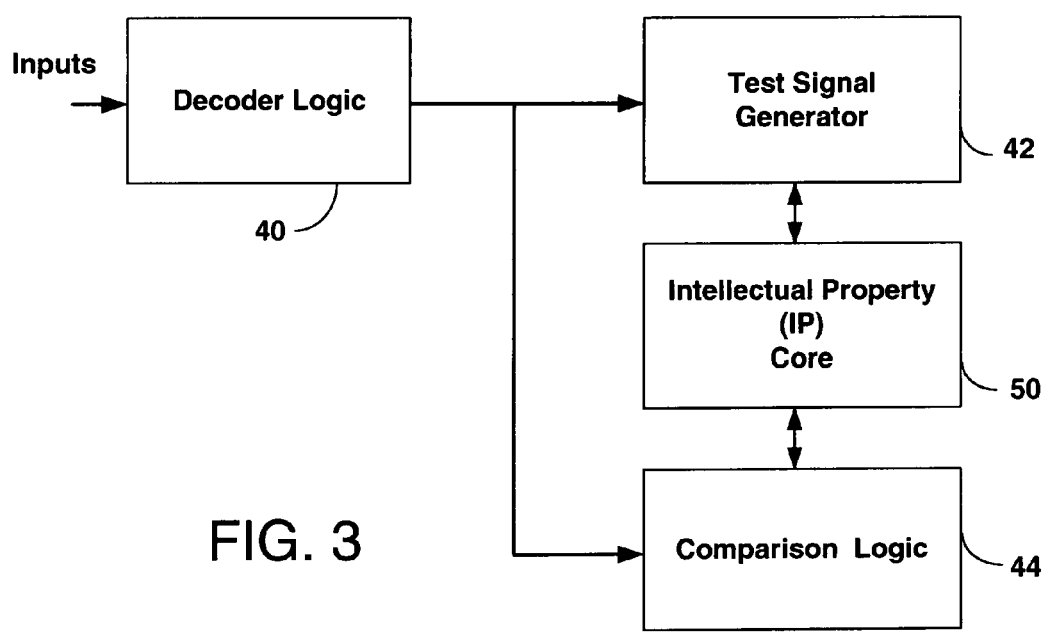
FIG. 3 shows a block diagram of BIST components allowing for testing of an FPGA after partial reconfiguration.

FIG. 3 shows a block diagram of components for a BIST system providing decoder logic 40 to enable detection of partial reconfiguration and continued operation of the BIST system after the partial reconfiguration to test the reconfigured system components. The decoder logic 40 can be provided using one or more CLBs of an FPGA configured to decode I/O buffer signals and provide an indication of the partial reconfiguration state. The decoder logic 40 can further take the form of an on board processor included in an FPGA to effectively decode I/O signals. Further, although I/O signals are indicated as inputs for evaluation, likewise internal signals can likewise be provided on buses or routed as signals within the FPGA and be evaluated by the decoder logic 40.

The BIST system further includes a test signal generator 42 that provides test signals to one or more modules, such as IP core 50. Although shown as an IP core 50, the one or more modules may be less complex module structures programmed into the logic of the FPGA. Test result signals provided from outputs of the IP core 50 are provided to comparison logic 44 that also forms part of a conventional BIST system. The comparison logic 44 compares the test result signals with expected result signals and provides a pass/fail signal as an output. Both the test signal generator 42 and the comparison logic 44 are programmed into logic of the FPGA.

With the decoder 40 providing an output signal indicating if partial reconfiguration occurred, both the test signal generator 42 and comparison logic 44 have inputs to receive the decoder output. Logic is further included in the test signal generator 42 to provide test signals depending on the partial reconfiguration mode, and logic is included in the comparison logic 44 to provide expected test results to match the partial reconfiguration mode of the IP core.

Partial reconfiguration sets up the routines to be used as well as the mode of the IP cores. For example in one mode the block RAM memories in the IP core 50 may accept an eight bit word, while in another mode the block RAM memories of the IP core 50 may accept a sixteen bit word. Using partial reconfiguration, thus, adds constraints to the BIST test signal generator 42 that drives the test pattern.

For manufacturing tests, many configurations modes are exercised since all possible operation scenarios for the entire FPGA needs to be tested. A large portion of the test time for field programmable gate arrays (FPGAs) is spent configuring the part using full configuration for testing. By using partial reconfiguration, only a small portion of the configuration memory covering selected frames that require changing must be changed in the FPGA from one test pattern to the next.

For testing by a manufacturer, or a customer that wishes to test multiple operation modes, the patterns of signals from the BIST test signal generator 42 must be changed to be able to test a variety of modes for the IP core with the different test patterns for different partial configurations. After partial configuration is performed for the different modes, to trigger the decoder logic 40 to change the test signal generator 42 to provide appropriate test patterns, an I/O signal can be provided in the new mode to trigger the decoder logic 40.

For embodiments of the present invention, partial reconfiguration that results in changes in signals that are detectable by the decoder logic 40 will be included in the available modes. With multiple modes, in some embodiments of the present invention the decoder logic indicates the mode detected rather than simply indicating partial reconfiguration occurred. With one or more operation modes created by only a small fraction of the FPGA being reconfigured, partial reconfiguration will make testing particularly efficient.

An example of a partial reconfiguration modes that can be detected by decoder logic 40 are modes that determine the word length for words written or read from block RAM. For a block RAM memory test, it is desirable to test that the block RAM functions correctly for a variety of word widths defined by the architecture. For example, assume that the block RAM can either have 4-bit word widths or 16-bit word widths. The BIST system will be able to test for both configurations of the block RAM, depending on the input (driven by primary input pins to the test pattern) to a decoder logic 40 which will either set up the BIST system for 4-bit or 16-bit word widths. Partial configuration will be used to change the block RAM configuration from 4-bit word width to 16-bit word width.

The idea of using a more complicated BIST engine and partial reconfiguration can be applied to a wide variety of IP cores of a FPGA. The block RAM word size is just one example. Another example will be to use this type of BIST engine to test optional inverters going into IP cores. For example, when a user instantiates a block RAM memory, the user can use either a rising edge or falling edge clock. Test patterns must test for both instances. Test patterns can be designated to test both instances or modes, with changing between modes accomplished using partial reconfiguration. In one mode the positive-edge clock can be used, and in the other mode an inverter and negative edge clock can be used without a major change in the test pattern functionality.

A constraint for this type of BIST pattern to test partial reconfiguration is that the same blocks of logic and routes are used to test different partial reconfigurations. To maximize efficiency, only minimal changes should be made between configurations from one partial configuration to another or else the time savings is greatly reduced. As a result, care must be taken in creating test patterns and generating testing bit streams to ensure that only specific frames of data changes from one bit stream to another.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for testing a Field Programmable Gate Array (FPGA) comprising:
   decoding a signal in the FPGA to determine a partial reconfiguration mode of an Intellectual Property (IP) core of the FPGA and a test mode associated with the partial reconfiguration mode;
   providing a test mode indication signal to a test signal generator, wherein the test signal generator provides test signal patterns to the IP core of the FPGA, and to comparison logic receiving output signals from the IP core that provides test pass/fail signals as an output, the test mode indication signal indicating the determined test mode for the test signal patterns provided from the test signal generator and for the output signals from the IP core.

2. The method of claim 1, wherein decoding further comprises selecting the test mode from a plurality of test modes according to the determined partial reconfiguration mode.

3. The method of claim 1, wherein the test signal generator and the comparison logic comprise components of a Built-in Self Test engine.

4. The method of claim 2, wherein the partial reconfiguration sets the word size for a block RAM of the FPGA.

5. The method of claim 2, wherein the partial reconfiguration sets either a positive edge clock or a negative edge clock.

6. A Built-in Self Test (BIST) system for an Integrated Circuit (IC) comprising:
   a decoder connected to an I/O of the IC for receiving I/O signals, the decoder determining from the I/O signals whether a partial reconfiguration of at least one component of the IC occurred, the decoder having an output providing a mode indication signal indicating different partial reconfiguration states for the IC;
   a test signal generator having an input connected to the decoder to receive the mode indication signal and an output connected to the at least one component of the IC to provide test signals, the test signal generator providing the test signals to the at least one component depending on the state of the mode indication signal; and
   a comparator having an input connected to the decoder to receive the mode indication signal and a second input connected to the output of the at least one component, the comparator determining pass or fail of signals from the at least one component in response to the test signals as determined in part from the state of the mode indication signal.

7. The BIST system of claim 6, wherein the IC comprises an FPGA.

8. A method for testing a Field Programmable Gate Array (FPGA) comprising:
   decoding an input signal provided to the FPGA to determine if partial reconfiguration has occurred;
   providing a partial reconfiguration indication signal to BIST circuitry of the FPGA indicating when a partial reconfiguration has occurred; and
   changing test signals provided from the BIST circuitry to test the FPGA when the partial reconfiguration indication signal indicates a partial reconfiguration occurred.

9. The method of claim 8, wherein partial reconfiguration changes the number of bits in a word received by the FPGA.

10. The method of claim 8, wherein partial reconfiguration changes whether signal transition occurs on a positive or a negative edge of a clock signal.

11. The method of claim 8, wherein the partial reconfiguration indication signal further indicates the particular reconfiguration mode.

12. The method of claim 8, further comprising:
   changing at least one of a pass or a fail condition determined from results of tests when the partial reconfiguration indicator signal indicates a partial reconfiguration occurred.

* * * * *